United States Patent [19]

Gessaman et al.

[11] Patent Number: 4,992,673
[45] Date of Patent: Feb. 12, 1991

[54] FAST SETTLING VOLTAGE TO FREQUENCY CONVERTER FOR HIGH SPEED ANALOG TO DIGITAL CONVERSION

[75] Inventors: Bill Gessaman, Everett; Paul Lantz; Jon Parle, both of Seattle, all of Wash.

[73] Assignee: John Fluke Mfg. Co., Inc., Everett, Wash.

[21] Appl. No.: 314,996

[22] Filed: Feb. 24, 1989

[51] Int. Cl.⁵ .............................................. H03L 7/00
[52] U.S. Cl. ..................................... 307/271; 307/261; 307/350; 307/362; 328/13; 328/36; 328/150
[58] Field of Search ............... 307/261, 271, 350, 362; 328/13, 36, 128, 135, 150; 341/157

[56] References Cited

U.S. PATENT DOCUMENTS

| | | | |
|---|---|---|---|
| 3,517,339 | 6/1970 | Hubbard et al. | 307/271 |
| 4,118,696 | 10/1978 | Warther | 340/347 NT |
| 4,169,287 | 9/1979 | Middendorf et al. | 364/835 |
| 4,256,983 | 3/1981 | Griffith et al. | 307/271 |
| 4,410,812 | 10/1983 | Honig et al. | 307/350 |
| 4,450,532 | 5/1984 | Massey | 364/703 |
| 4,573,037 | 2/1986 | Robinton et al. | 340/347 NT |
| 4,623,800 | 11/1986 | Price | 307/261 |
| 4,695,742 | 9/1987 | Randall | 307/271 |
| 4,724,419 | 2/1988 | Krevzer | 341/157 |
| 4,839,653 | 6/1989 | Devito | 341/157 |
| 4,839,788 | 6/1989 | Tullsen | 363/63 |
| 4,847,620 | 7/1989 | Trofimenkoff et al. | 307/261 |

FOREIGN PATENT DOCUMENTS

0651478 3/1979 U.S.S.R. ............... 341/157

Primary Examiner—Stanley D. Miller
Assistant Examiner—T. Cunningham
Attorney, Agent, or Firm—Israel Gopstein

[57] ABSTRACT

A circuit arrangement reduces the time necessary for a voltage-to-frequency converter to provide a new output frequency in response to a change in input voltage levels. A current source provides additional input current to the input integrating node of the v/f before a conversion is requested. When a conversion is requested, the additional input current effectively provides operation of the v/f at an increased frequency, thus speeding the settling process therefor. When the integrator of the v/f is at a predetermined voltage level in a predetermined operating cycle, the current source is removed, thus terminating the increased frequency of operation.

20 Claims, 4 Drawing Sheets

FAST SETTLING VOLTAGE TO FREQUENCY CONVERTER FOR HIGH SPEED ANALOG TO DIGITAL CONVERSION

TECHNICAL FIELD

This invention relates to voltage-to-frequency converters, and more particularly to charge-balanced voltage-to-frequency converters wherein a circuit component is included for educing the amount of time required for the converter to change from one frequency to another.

BACKGROUND ART

Voltage-to-frequency converters are known in the prior art for use in analog-to-digital converters. Thus, prior art analog-to-digital converters are known to include a multiplexer providing successive voltage levels to a signal conditioning and buffer amplifier for output to a voltage-to-frequency converter. A counter is connected to the output of the voltage-to-frequency converter to provide a digital output count, representing the input analog voltage level.

Typically, auto-zeroing circuits may be included to determine, for each counting and measuring cycle, an output offset voltage from the signal conditioning and buffer amplifier. A synchronizing signal, referred hereinafter as a voltage convert request signal, requests performance of a conversion. A known analog-to-digital converter of this type performs 1200 conversions per second. Thus, in such a converter there is available a duration of approximately 800 microseconds for each cycle of measurement. Where 200–300 microseconds are required by the multiplexer to provide the next input level to the amplifier and buffer, as well as for the buffer to settle and provide a stable output, approximately 500 microseconds remain to digitize the signal output by the voltage-to-frequency converter.

That is, approximately 500 microseconds are available for measurement of the frequency output by the voltage-to-frequency converter.

For charge-balanced voltage-to-frequency converters, there is provided a two-cycle sequence of operation. In a first cycle of operation, the reset cycle, an input capacitance of an integrator is charged by a current derived from an input voltage source and from a current source for a fixed time interval. In a second cycle of operation, the integration cycle, the charge is dissipated by integrating the current derived from the input voltage source. During this discharge cycle, a comparator detects the output voltage level from the integrator and, upon matching a predetermined threshold, an output pulse is generated. Generation of the output pulse completes the conversion and initiates a new sequence.

The frequency of the output pulses is determined by the sum of the time periods for both the reset and integration cycles.

It is known that when the input voltage changes from one level to another the frequency of the output pulses changes from a value representing the first voltage level to a value representing the second voltage level. The time required for the frequency to stabilize to the value representing the second voltage level typically requires one complete cycle of operation. When the voltage-to-frequency converter operates at frequencies ranging from 10 kHz to 100 kHz, where 10 kHz represents a zero input voltage level, such a change may require passage of 100–200 microseconds prior to obtaining a stable output frequency. Thus, approximately 20% of the time available for frequency measurement and conversion is used in settling to the new frequency value.

Loss of 100 microseconds out of a 500 microsecond available time period thus represents a loss of 20% of resolution of measurement. There is accordingly a need in prior art circuits to reduce the amount of time consumed by voltage-to-frequency converters in settling from one frequency to another frequency upon changes in voltage levels input thereto.

DISCLOSURE OF INVENTION

It is accordingly an object of the present invention to improve operating characteristics by reducing the portion of the conversion time required for stabilizing the voltage-to-frequency converter output frequency to a new value.

It is a primary object of the invention to provide a circuit for speeding up a transition of a voltage-to-frequency converter from one frequency to another frequency.

It is a more specific object of the invention to provide a speed-up circuit for generating a speed-up current to reduce the time required for balancing the initial charge condition of a voltage-to-frequency converter.

Yet another object of the invention is to provide a speed-up circuit for reducing the settling time required by a voltage-to-frequency converter in response to an input voltage level transition by causing the converter to operate at a high frequency during the settling time, thus reducing the time required to establish the new frequency value.

Still another object of the invention is to provide a speed-up circuit responsive to a conversion request signal of an analog-to-digital converter for generating an increased current for one charge balancing cycle and for one integration cycle, and for providing an output control signal to enable a gating circuit to pass output pulses from the voltage-to-frequency converter only after removal of the speed-up current.

A more detailed object of the invention is to provide a circuit for removal of initial conditions from a charged capacitor of a voltage-to-frequency converter in a shorter time than otherwise required by provision of an additional current to an integrating node thereof.

It is another object of the invention to provide a speed-up current generator including a discriminating circuit for discriminating between a reset and an integrating cycle of operation of the voltage-to-frequency converter for enabling passage of output pulses from the converter upon termination of a high-speed integrating cycle.

In accordance with one embodiment of the present invention, there is provided an improved charge balanced voltage-to-frequency converter. Such a converter outputs pulses at a frequency determined by a voltage level input thereto. The voltage-to-frequency converter has a first cycle for resetting or initializing an integrator thereof and a second integration cycle for balancing the charge condition in the integrator thereof. The improvement of the invention includes a settling time reducing apparatus for reducing a time required by the voltage-to-frequency converter to change the frequency of output pulses provided thereby from a first frequency to a second frequency in response to a change in voltage input thereto from a first voltage level to a second voltage level. The settling time reducing apparatus includes a speed-up current generating circuit for generating a speed-up current to reduce the time required for balancing the charge condition following a change in input voltage to the voltage-to-frequency converter, and a synchronizing circuit responsive to a voltage-conversion request signal for removing the speed-up current when the integrated input voltage is at a predetermined voltage level. Thus, initial conditions of the voltage-to-frequency converter caused by the first voltage level are removed in a shorter time than required for such removal in response to unaided integration of the input voltage.

Preferably, a gating circuit is included, the gating circuit being responsive to the synchronizing circuit. The gating circuit is connected for receiving an output signal from the voltage-to-frequency converter and an enabling output from the synchronizing circuit to output the voltage-to-frequency converter output signal. The synchronizing circuit provides the enabling output to enable the gating circuit only when the integrated input voltage is at the predetermined voltage level and the speed-up current is removed.

The synchronizing circuit may further include a cycle identifying circuit responsive to the request signal for differentiating between a resetting cycle and an integration cycle of operation of the voltage-to-frequency converter. Additionally, in the synchronizing circuit there may be provided a removing circuit, responsive to the identifying circuit and to an output voltage of the integrator, for removing the speed-up current from the voltage-to-frequency converter when the output voltage of the integrator is at a preselected threshold level during a predetermined cycle of operation of the voltage-to-frequency converter. The synchronizing circuit may include a circuit for activating the gating circuit when the predetermined voltage level is detected in an integrating cycle of operation of the voltage-to-frequency converter.

Thus, the removing circuit is preferably operable to remove the speed-up current from the voltage-to-frequency converter when the output voltage of the integrator is at the preselected threshold level during an integrating cycle of operation of the voltage-to-frequency converter.

The identifying circuit preferably includes a comparator, receiving first and second inputs, a threshold voltage selecting circuit, for providing the preselected threshold level to the first input of the comparator, and a first bistable circuit (flip flop) responsive to an output transition in a predetermined direction from the comparator. The comparator is responsive to the output voltage of the integrator at the second input thereof. The first bistable circuit is preferably arranged to be responsive to a transition during a balancing cycle of operation of the voltage-to-frequency converter. The removing circuit additionally includes a second bistable circuit, responsive to the first bistable circuit and to the comparator, for removing the speed-up current from the voltage-to-frequency converter at a next output transition of the comparator, during an integrating cycle next following the balancing cycle. An output gating circuit may be included, responsive to the removing circuit. In this arrangement, the gating circuit is connected for receiving an output signal from the voltage-to-frequency converter and an enabling output from the removing circuit. The removing circuit thus provides the enabling output to enable the gating circuit only when the integrated input voltage is at the predetermined voltage level and the speed-up current is removed.

In an alternative embodiment of the invention, the settling time reducing circuit includes a controlled current generating circuit, for controlling the voltage-to-frequency converter to operate at a high frequency thereby to reduce the time required for balancing the charge condition following a change in input voltage to the voltage-to-frequency converter.

In this arrangement, the synchronizing circuit provides the enabling output, for enabling the gating circuit to output the voltage-to-frequency converter output signal only when the integrated input voltage is at the predetermined voltage level and the controlled current source is removed to terminate the high frequency operation of the voltage-to-frequency converter. The removing circuit, responsive to the identifying circuit and to an output voltage of the integrator, is operable for removing the controlled current source from the voltage-to-frequency converter and terminating the high frequency operation thereof when the output voltage of the integrator is at a preselected threshold level during a predetermined cycle of operation of the voltage-to-frequency converter.

Other objects, features and advantages of the present invention will become readily apparent to those skilled in the art from the following description wherein there is shown and described a preferred embodiment of the invention, simply by way of illustration and not of limitation of one of the best modes (and alternative embodiments) suited to carry out the invention. As will be realized upon examination of the specification and from practice of the same, the present invention is capable of still other, different, embodiments and its several details are capable of modifications in various obvious aspects, all without departing from the invention. Accordingly, the drawings and the descriptions provided herein are to be regarded as illustrative in nature and not as restrictive of the invention.

BRIEF DESCRIPTION OF THE DRAWINGS

In accordance with the above described objects and features of the invention, a preferred embodiment thereof is shown in the accompanying drawings, wherein.

BEST MODE FOR CARRYING OUT THE INVENTION

Figure 1:
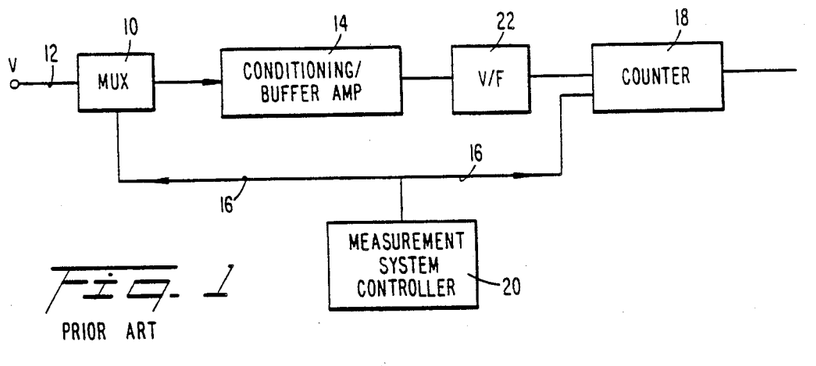
FIG. 1 is a block diagram representation of a known analog-to-digital converter using a charge balanced voltage-to-frequency converter.

Referring now to FIG. 1, there is shown in block diagram form a known analog-to-digital converter. Such a converter includes a multiplexer 10 receiving an input signal on input lead 12 and outputting signal samples at appropriate times to a signal conditioning and buffer amplifier 14. A measurement system controller 20, which cycles multiplexer 10 among its inputs, outputs a conversion request signal on an output lead 16. The request signal is provided both to a counter 18 and to the multiplexer 10. Upon receipt of the conversion request signal, the multiplexer 10 selects the appropriate input. The voltage levels in signal conditioning and buffer amplifier 14 and in voltage-to-frequency converter 22 settle, and the counter 18 provides a measurement of the input voltage as follows.

Voltage-to-frequency converter 22 receives the conditioned voltage levels and outputs sequences of pulses at frequencies corresponding to the input voltage levels. The sequences of pulses are counted by counter 18 to provide the digital output count representing the analog input voltage level.

Figure 2:
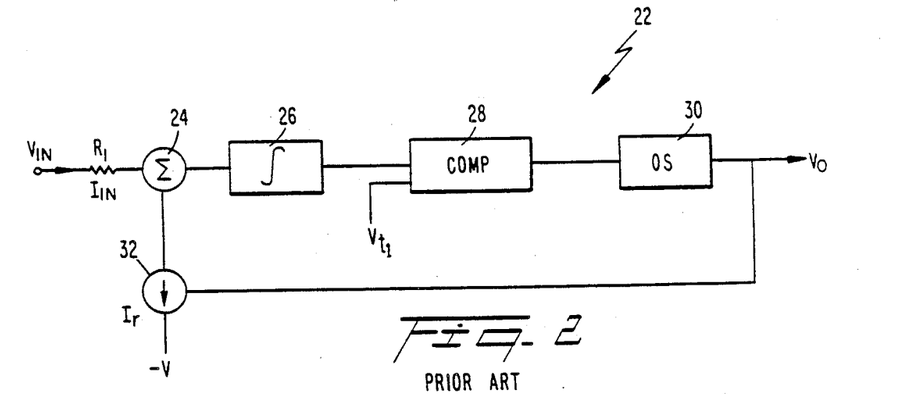
FIG. 2 shows a known voltage-to-frequency converter.

FIG. 2 represents in block diagram form the structure of a known voltage-to-frequency converter 22. Such a voltage-to-frequency converter typically may be a charge-balanced converter, wherein an input current derived from the input voltage is provided to a summing node 24. There is also a reset current source 32 which can be gated into node 24 by a one-shot circuit 30. The one-shot circuit, triggered by the output of a comparator 28, generates a reset pulse. During the reset pulse, which is of fixed time duration, the sum of the input current and the reset current causes the integrator to be reset. After the reset cycle, there is an integrate cycle in which the input current alone causes the integrator to ramp back down to the threshold voltage of comparator 28. At that threshold the output of comparator 28 changes state, triggering one-shot 30, beginning the next reset cycle. Because the voltage on a capacitor associated with integrator 26 is always returned to the same level, the net charge on it is zero, hence the charge is "balanced."

Illustratively, when a positive input current derived from an input voltage level $V_1$ is applied to the integrator 26, integrator 26 provides an output ramp having a negative slope. When comparator 28 detects that the value of the ramp matches threshold value $V_{t1}$, which may be ground level, for example, an output transition is generated thereby causing one-shot circuit 30 to output a pulse having a duration $T_r$ determined by an RC time constant thereof.

The positive pulse from the one-shot circuit 30 switches a reset current $I_r$ into the summing node of the integrator for the fixed length of time $T_r$.

As is appreciated by those skilled in the art, in an equilibrium, steady state, condition the average charge transfer into the integrating capacitance is zero. Thus, charge input to the capacitance during the integrating cycle is balanced by charge drawn from the capacitance during the reset cycle.

For a substantially constant input current to the integrator, the input charge is given by $T_{int} \times I_{in}$, where $T_{int}$ is the duration of the integration cycle and $I_{in}$ is the input current to the integrating node, which remains substantially constant throughout the integration. Moreover, for the short time durations under consideration, so long as the input voltage does not change the input current remains substantially constant throughout the integration and reset cycles. The withdrawn charge is thus given by $T_r \times (I_r - I_{in})$, where $T_r$ is the duration of the reset cycle and $I_r$ is the magnitude of the reset current drawn from the summing node.

The output frequency is given by $F = 1/(T_r + T_{int})$. To obtain the relationship between the output frequency and the input voltage, $V_{in}$, at the summing node, it is recognized that the input current $I_{in} = V_{in}/R_i$, where $R_i$ is the input resistance to the summing node of the integrator 26, which is at virtual ground.

Thus, $$I_{in} = V_{in}/R_i \tag{1}$$

$$T_{int} \cdot I_{in} = T_r(I_r - I_{in}) \tag{2}$$

$$(T_{int} + T_r)I_{in} = T_r I_r \tag{3}$$

and $$F = \frac{1}{(T_{int} + T_r)} = \frac{I_{in}}{T_r I_r} = \frac{V_{in}}{R_i T_r I_r} \tag{4}$$

Figure 3A:
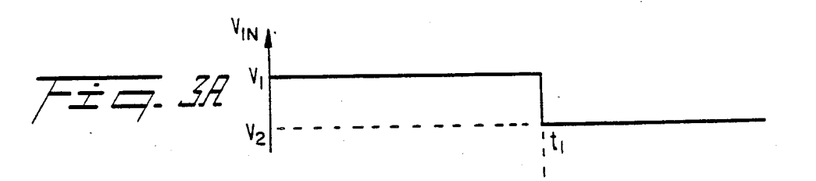
FIGS. 3A, 3B and 3C show voltage waveforms at three points of the converter shown in FIG. 2.
Figure 3B:
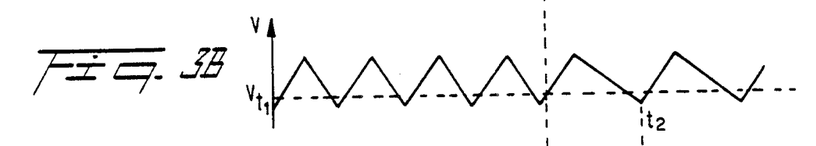
Figure 3C:
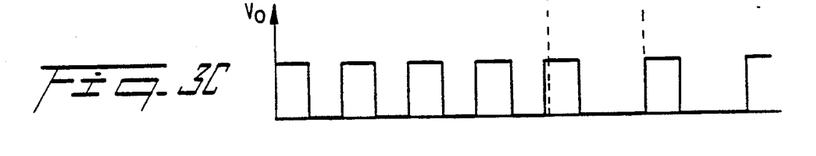

The above relationships may be appreciated from the various waveforms shown at FIG. 3. In FIG. 3A there is shown the input voltage to summing node resistor $R_i$. At FIG. 3B is shown the voltage waveform at the output of integrator 26, including the repetitive alternation of reset and integration cycles, seen as the respective rising and falling ramp segments of the waveform. FIG. 3C illustrates the sequence of output pulses, generated by the one-shot circuit 30.

When the input voltage $V_{in}$ provided to summing node 24 changes from $V_1$ to $V_2$, the frequency of the output pulses changes, as illustrated by the change occurring in input voltage $V_{in}$ at time $t_1$ in FIG. 3A and the resultant change in repetition frequency of the waveform in FIG. 3C. However, although the input voltage changes at time $t_1$, the earliest time at which the new frequency may begin to be determined accurately is $t_2$, i.e., only when at least one pulse has occurred at the new frequency. Since the transition from $V_1$ to $V_2$ may occur at any time during either of the reset or integrating cycles, the time to occurrence of the first pulse after the transition is not a reliable indicator of the new frequency. The period of the new frequency is first reliably indicated by the time between the first and second pulses following the transition in input voltage. Accordingly, the new frequency cannot accurately begin to be counted until detection of the first pulse following the transition in voltage levels. The settling time of known voltage-to-frequency converters is accordingly as long as a full cycle of the new frequency.

As hereinabove noted, where the new voltage $V_2$ is at the low voltage represented by a frequency of 10 kHz, the time between $t_1$ and $t_2$ may thus be as much as 100 microseconds, significantly reducing the amount of time available for making the measurement.

Figure 4:
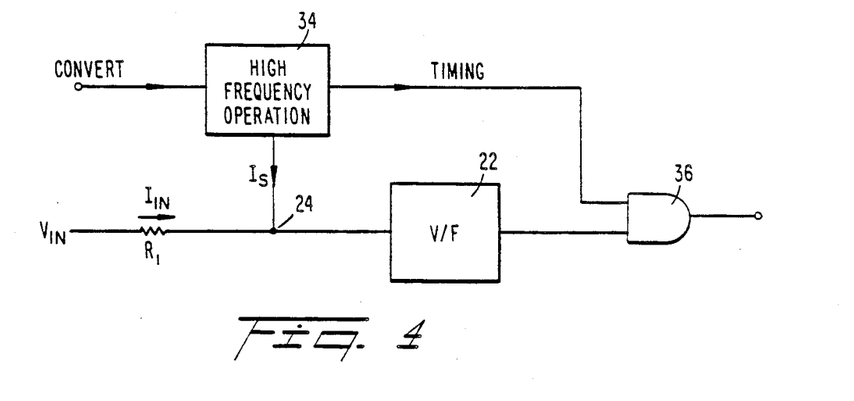
FIG. 4 shows a modification of the converter of FIG. 2 in accordance with the present invention.

In order to reduce the settling time, the present invention modifies the connection of the voltage-to-frequency converter in the prior art analog-to-digital converter as shown in FIG. 4. More particularly, a circuit 34 is added to induce high frequency operation in the converter during the transition period. The high-frequency operation circuit 34 generates a speed-up current Is, for input to summing node 24 during the settling time following a transition in input voltage.

Operation of the inventive modification may be understood upon reference to FIG. 1, wherein it is recalled that a measurement system controller 20 provides a convert request signal at each sample input time. The convert request signal initiates a cycle of operation in known analog-to-digital converters wherein the new input voltage selected by the multiplexer 10 is allowed to settle and analog to digital conversion is performed.

According to the invention, the same conversion request (timing) signal which is applied to the multiplexer and counting circuits is applied to trigger a speed-up current generating circuit by triggering a synchronizing circuit within the high frequency operation circuit 34. The synchronizing circuit outputs a timing signal to a gating circuit 36 to enable and disable the gating circuit 36 to inhibit the passage of the output pulses of the voltage-to-frequency converter 22.

Figure 5:
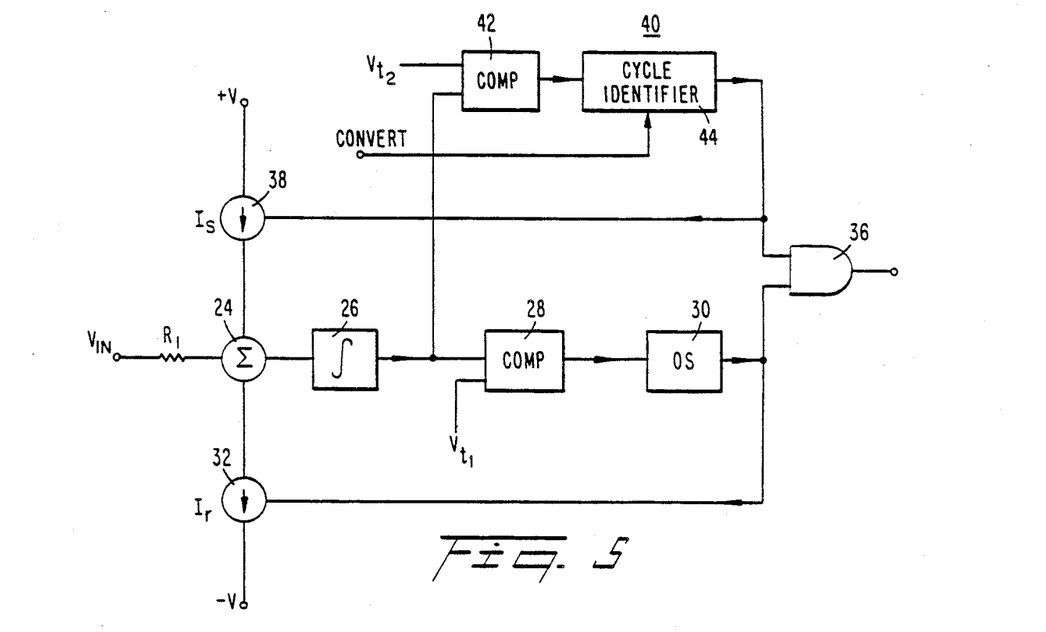
FIG. 5 is a block diagram showing the modification of FIG. 4 in greater detail.

As will be appreciated from the following description of operation of the circuit of FIG. 5, the speed-up current applied by the present invention causes the voltage-to-frequency converter to operate at a high frequency which is not necessarily representative of the input voltage. Accordingly, gating circuit 36 blocks output pulses generated by the voltage-to-frequency converter from being counted by counter 18. Once the speed-up current is removed from the summing node, the timing signal output by the synchronizing circuit enables gating circuit 36 to pass the output pulses of the voltage-to-frequency converter, now produced at the appropriate output frequency, for counting by counter 18.

Referring now to FIG. 5, the high frequency operation circuit 34 is shown as including a speed-up current source 38, which provides a speed-up current Is to summing node 24 during the time when the buffer amplifier is being allowed to settle or at other times when the voltage-to-frequency converter is not used for frequency conversion. During this time, the current source 38 applies an additional current Is to node 24. This current may be selected to be any value, but in the presently preferred embodiment a current equivalent to operation at the highest operating frequency, 100 kHz (corresponding to full scale input voltage), is applied. Since an input current $I_{in}$ is also provided by the input voltage $V_{in}$, the voltage-to-frequency converter operates during the reduced settling time at a frequency equal to or greater than the high-frequency established by circuit 34.

Thus, one to two full cycles of the increased frequency, which is at most 20 microseconds, is required for settling of the circuit modified in accordance with the invention. The present invention thus reduces the maximum settling time from 100 microseconds to less than 20 microseconds, a significant improvement.

A synchronizing circuit 40 responds to the frequency conversion request signal by triggering the current source 38, thus applying the speed-up current to the voltage-to-frequency converter 22, and by disabling gating circuit 36. The synchronizing circuit 40 includes a comparator 42, which compares the integrated input voltage output by integrator 26 with a threshold level $V_{t2}$, which is slightly above level $V_{t1}$, the other known trip point for the voltage-to-frequency converter, where both thresholds are very close to zero.

Synchronizing circuit 40 also includes a cycle identifying circuit 44 which removes the speed-up current Is from voltage-to-frequency converter 22 and enables gating circuit 36, in response to detection of a match between the integrated voltage and the threshold voltage $V_{t2}$ during the integration cycle of operation. This leaves the voltage to frequency converter ready to begin a full cycle at the new frequency.

Figure 6:
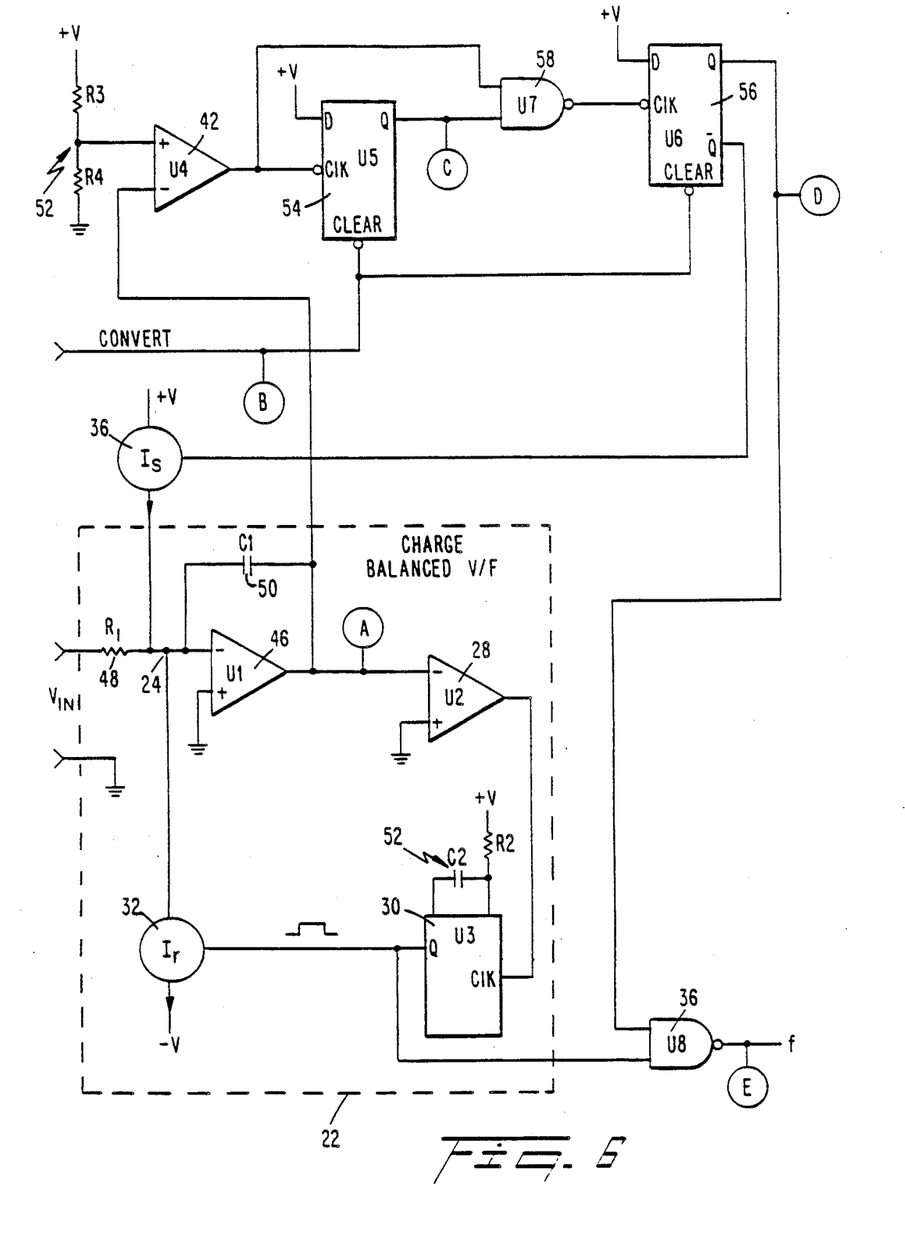
FIG. 6 is a detailed circuit diagram of the embodiment of the invention shown in FIG. 5.

Referring now to FIG. 6, there is illustrated a detailed circuit embodiment of the arrangement of FIG. 5. More particularly, integrator 26 of the voltage-to-frequency converter 22 includes an operational amplifier 46, a resistor 48 forming the resistance Ri mentioned hereinabove, and a feedback capacitor 50. Comparator 28 compares the output voltage of integrator 26 with a ground level threshold voltage, and a pulse width adjusting RC circuit 52 is shown for the one-shot circuit 30. A switched current source is symbolically shown at 32 and may be arranged in any well-known circuit structure.

The comparator 42 of synchronizing circuit 40 is seen to compare the output of integrator 26 with a separately set threshold voltage, as determined by a resistive voltage divider 53. Cycle identifying circuit 44 includes first and second, negatively triggered, flip-flops 54 and 56. The frequency conversion request signal is used to enable the two flip-flops, and a gate 58 is enabled by the output of comparator 42 to trigger flip-flop 56 in response to selected occurrences of the Q output of flip-flop 54. The Q output of flip-flop 56 is used as the timing signal output by the synchronizing circuit to enable gate 36.

Figure 7A:
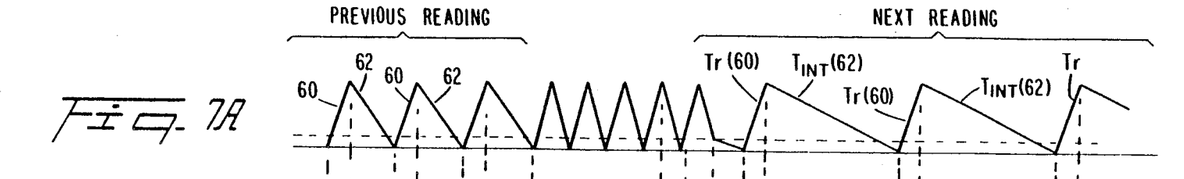
FIG. 7A, 7B, 7C, 7D and 7E are waveforms at various points in the circuit of FIG. 6.
Figure 7B:
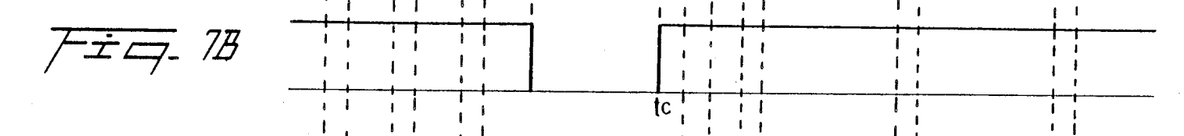

Operation of the circuit of FIG. 6 is illustrated by the waveforms shown in FIGS. 7A–7E. As shown therein, the waveform of FIG. 7A represents the output voltage of integrator 26 and comprises alternating reset and integration cycles 60 and 62. In that regard, it will be appreciated by those skilled in the art that the directions of the reset and integration cycles may be reversed.

Figure 7C:
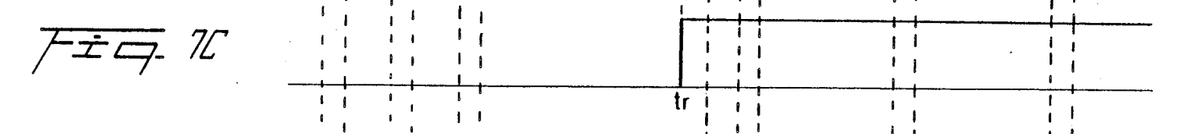
Figure 7D:
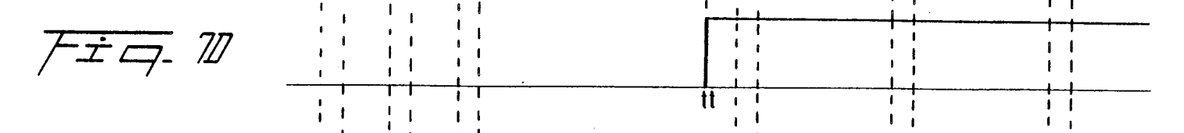
Figure 7E:
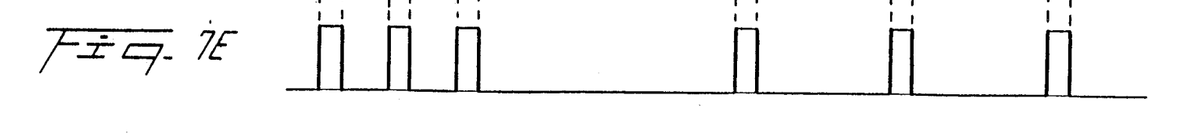

The voltage-to-frequency converter operates at a frequency represented by the repetition rate for the waveform of FIG. 7A. A sequence of pulses is output from gate circuit 36, as shown at FIG. 7E. At some time (not shown) the input voltage is presumed to change. Some time thereafter, at a time $t_c$, the measurement system controller 20 generates the conversion request signal, shown at FIG. 7B. Between measurements the low conversion request signal clears flip-flops 54 and 56, disabling gating circuit 36 and interrupting passage of pulses therethrough. During this time the Q-bar output of flip-flop 56, which becomes high by clearing of the flip-flop, switches ON the current source 36 causing the rapid charging of capacitor 50 to a predetermined, known, charge level causing the voltage to frequency converter to run at a maximum rate.

The integration cycle of the voltage-to-frequency converter brings the converter to a known initial condition. Accordingly, it is desirable to apply the speed-up current through an integrating cycle and to remove the current source at the end of the integration cycle. Thus the speed up current quickly returns the integrator to a known state for the reaching of the next cycle.

Flip-flops 54 and 56, together with gate 58, form the cycle identifying circuit 44 which removes the speed up current from the summing node 24. Flip-flops 54 and 56 are clocked and triggered by the falling edge of an input signal. The Q-output of flip-flop 54 is shown at FIG. 7C. This conversion request signal is normally low causing the high frequency operation circuit 34 to apply a speed up circuit to the voltage to frequency converter 22 while inhibiting any output pulses to the counting circuitry. When a reading is requested by the measurement system controller 20 the conversion request signal goes high and remains high until the reading is complete. When the conversion request signal goes high at time $t_c$, flip-flops 54 and 56 have the initial conditions which were acquired when they were reset by the low conversion request signal. During the reset cycle of operation, the output voltage from integrator 26 is rising. This voltage is input to the inverting input of comparator 42. Accordingly, the reset cycle of operation is identified by a falling transition at the output of comparator 42, occurring when the output of integrator 26 matches the threshold $V_{t2}$.

This transition, occurring at a time tr, clocks flip-flop 54 to provide a high level Q output, as shown in FIG. 7C. That is, the Q output of flip-flop 54 rises on the next reset cycle after the conversion request signal is generated. Gate 58 is enabled by the Q output of flip-flop 54 so that flip-flop 56 is triggered on the next rising output of comparator 42. This rising output occurs at time tt in the next integration cycle, when the output voltage of integrator 26 drops below the threshold voltage Vt.

Accordingly, flip-flop 56 is triggered to a set condition at time tt, substantially upon completion of an integration cycle. Consequently, the Q-bar output level drops, thus removing the speed-up current from the summing node. Further, the Q output of flip-flop 56, which rises as shown at FIG. 7D, enables gating circuit 36 to pass the next output pulses from voltage-to-frequency converter 22. These next pulses are seen in the output signal waveform, shown in FIG. 7E.

Once the speed-up current source 36 is removed, the only current entering the summing node is due to the input voltage provided thereto by the buffer amplifier. For low input voltages, the charging rate may be quite low, thus delaying the generation of the next pulse by one-shot circuit 30. The low charging rate is reflected by the reduced slope of the integration cycle in FIG. 7A between time tt and the initiation of the next reset cycle. It is accordingly advantageous to choose a threshold voltage for comparator 42 which is as close as possible to zero, the threshold used in comparator 28 to initiate the output pulses of the one-shot.

The first pulse which is passed by gating circuit 36 thus is used by the counter 18 of the analog-to-digital converter.

The present invention thus reduces the time necessary to remove any initial conditions due to previous voltage levels input to a voltage-to-frequency converter. The reduction in settling time is attained by providing a speed-up current to the summing node of the converter, and by removing the speed-up current at a predetermined point in the operating cycle of the converter. The speed-up current provides operation at effectively higher frequencies, thus shortening the time required to obtain the first reliable pulse at a new frequency when a voltage level change is input to the converter.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

I claim:

1. In a charge balanced voltage-to-frequency converter generating output pulses at a frequency determined by a voltage level of an input voltage provided thereto, the voltage-to-frequency converter having a first cycle for resetting an integrator thereof, and a second cycle for integrating said input voltage and balancing a charge condition in the integrator thereof, the improvement comprising:
    settling time reducing means for reducing a time required by said voltage-to-frequency converter to change the frequency of output pulses provided thereby from a first frequency to a second frequency in response to a change in voltage input thereto from a first voltage level to a second voltage level,
    said reducing means including:
    speed-up current generating means for generating a speed-up current to reduce the time required for balancing said charge condition following a change in input voltage to said voltage-to-frequency converter, and
    means for applying said speed-up current to the integrator of said voltage-to-frequency converter,
    whereby initial conditions of said voltage-to-frequency converter caused by said first voltage level are removed in a shorter time than required for such removal in response to unaided integration of the input voltage.

2. An improved voltage-to-frequency converter as recited in claim 1, further comprising applying and removing means responsive to a voltage-conversion request signal for removing said speed-up current generated by said speed-up current generating means when the integrated input voltage is at a predetermined voltage level.

3. An improved voltage-to-frequency converter as recited in claim 2, further comprising gating means responsive to said applying and removing means,
    said gating means connected for receiving an output signal from said voltage-to-frequency converter and an enabling output from said applying and removing means,
    said applying and removing means providing said enabling output to enable said gating means to output said voltage-to-frequency converter output signal only when said integrated input voltage is at said predetermined voltage level and said speed-up current is removed.

4. An improved voltage-to-frequency converter as recited in claim 3, wherein said applying and removing means comprises means for activating said gating means when said predetermined voltage level is detected in an integrating cycle of operation of said voltage-to-frequency converter.

5. An improved voltage-to-frequency converter as recited in claim 2, wherein said applying and removing means comprises:
    cycle identifying means responsive to said voltage-conversion request signal for differentiating between an integrating cycle and a resetting cycle of operation of said voltage-to-frequency converter, and
    wherein said applying and removing means is responsive to an output voltage of said integrator by removing said speed-up current from said voltage-to-frequency converter when the output voltage of said integrator is at a preselected threshold level during a predetermined cycle of operation of said voltage-to-frequency converter.

6. An improved voltage-to-frequency converter as recited in claim 5, wherein said removing means is operable to remove said speed-up current from said voltage-to-frequency converter when the output voltage of said integrator is at said preselected threshold level during an integrating cycle of operation of said voltage-to-frequency converter.

7. An improved voltage-to-frequency converter as recited in claim 2, wherein said applying and removing means comprises:
   comparator means receiving first and second inputs,
   threshold voltage selecting means for providing said preselected threshold level to said first input of said comparator means,
   said comparator means responsive to the integrated input voltage output by said integrator at said second input thereof, and
   first bistable circuit means responsive to an output transition in a predetermined direction from said comparator means.

8. An improved voltage-to-frequency converter as recited in claim 7, wherein said first bistable circuit means is arranged to be responsive to a transition during a balancing cycle of operation of said voltage-to-frequency converter,
   said applying and removing means further comprising:
   second bistable circuit means responsive to said first bistable circuit means and to said comparator means for removing said speed-up current from said voltage-to-frequency converter at a next output transition of said comparator means during an integrating cycle next following said balancing cycle.

9. An improved voltage-to-frequency converter as recited in claim 5, further comprising output gating means responsive to said applying and removing means,
   said gating means connected for receiving an output signal from said voltage-to-frequency converter and an enabling output from said applying and removing means,
   said applying and removing means providing said enabling output to enable said gating means to output said voltage-to-frequency converter output signal only when said integrated input voltage is at said predetermined voltage level and said speed-up current is removed.

10. An improved voltage-to-frequency converter as recited in claim 7, wherein said applying and removing means further comprises:
    second bistable circuit means responsive to said first bistable circuit means and to said comparator means for removing said speed-up current from said voltage-to-frequency converter at a next output transition of said comparator means, during an operating cycle of said voltage-to-frequency converter next following a cycle during which said first bistable circuit means responds to said output transition in said predetermined direction from said comparator means.

11. In a charge balanced voltage-to-frequency converter generating output pulses at a frequency determined by a voltage level of an input voltage provided thereto, the voltage-to-frequency converter having a first cycle for resetting an integrator thereof, and a second cycle for integrating said input voltage and balancing a charge condition in said integrator thereof, the improvement comprising:
    settling time reducing means for reducing a time required by said voltage-to-frequency converter to change the frequency of output pulses provided thereby from a first frequency to a second frequency in response to a change in voltage input thereto from a first voltage level to a second voltage level,
    said reducing means including:
    controlled current generating means for controlling said voltage-to-frequency converter to operate at a high frequency thereby to reduce the time required for balancing said charge condition following a change in input voltage to said voltage-to-frequency converter, and
    means for providing an output from said controlled current generating means to the integrator of said voltage-to-frequency converter,
    whereby initial conditions of said voltage-to-frequency converter caused by said first voltage level are removed in a shorter time than required for such removal in response to unaided integration of the input voltage.

12. An improved voltage-to-frequency converter as recited in claim 11, further comprising applying and removing means responsive to a voltage-conversion request signal for disconnecting said controlled current generating means from said voltage-to-frequency converter when the integrated input voltage is at a predetermined voltage level.

13. An improved voltage-to-frequency converter as recited in claim 12, further comprising gating means responsive to said applying and removing means,
    said gating means connected for receiving an output signal from said voltage-to-frequency converter and an enabling output from said applying and removing means,
    said applying and removing means providing said enabling output to enable said gating means to output said voltage-to-frequency converter output signal only when said integrated input voltage is at said predetermined voltage level and said output of said controlled current generating means is removed to terminate said high frequency operation of said voltage-to-frequency converter.

14. An improved voltage-to-frequency converter as recited in claim 13, wherein said applying and removing means comprises means for activating said gating means when said predetermined voltage level is detected in an integrating cycle of operation of said voltage-to-frequency converter.

15. An improved voltage-to-frequency converter as recited in claim 12, wherein said applying and removing means comprises:
    cycle identifying means responsive to said voltage-to-conversion request signal for differentiating between an integrating cycle and a balancing cycle of operation of said voltage-to-frequency converter, and
    wherein said applying and removing means is responsive to an output voltage of said integrator by removing said output of said controlled current generating means from said voltage-to-frequency converter and terminating said high frequency operation thereof when the output voltage of said integrator is at a preselected threshold level during a predetermined cycle of operation of said voltage-to-frequency converter.

16. An improved voltage-to-frequency converter as recited in claim 15, wherein said applying and removing means is operable to remove said output of said controlled current generating means from said voltage-to-frequency converter for terminating said high frequency operation thereof when the output voltage of said integrator is at said preselected threshold level during an integrating cycle of operation of said voltage-to-frequency converter.

17. An improved voltage-to-frequency converter as recited in claim 12, wherein said applying and removing means comprises:
  comparator means receiving first and second inputs,
  threshold voltage selecting means for providing said preselected threshold level to said first input of said comparator means,
  said comparator means responsive to the integrated input voltage output by said integrator at said second input thereof, and
  first bistable circuit means responsive to an output transition in a predetermined direction from said comparator means.

18. An improved voltage-to-frequency converter as recited in claim 17, wherein said first bistable circuit means is arranged to be responsive to a transition during a balancing cycle of operation of said voltage-to-frequency converter,
  said applying and removing means further comprising:
  second bistable circuit means responsive to said first bistable circuit means and to said comparator means for removing said output of said controlled current generating means from said voltage-to-frequency converter to terminate said high frequency operation thereof at a next output transition of said comparator means during an integrating cycle next following said balancing cycle.

19. An improved voltage-to-frequency converter as recited in claim 15, further comprising output gating means responsive to said applying and removing means,
  said gating means connected for receiving an output signal from said voltage-to-frequency converter and an enabling output from said applying and removing means,
  said applying and removing means providing said enabling output to enable said gating means to output said voltage-to-frequency converter output signal only when said integrated input voltage is at said predetermined voltage level and said output from said controlled current generating means is removed.

20. An improved voltage-to-frequency converter as recited in claim 17, wherein said applying and removing means further comprises:
  second bistable circuit means responsive to said first bistable circuit means and to said comparator means for removing said output of said controlled current generating means from said voltage-to-frequency converter to terminate said high frequency operation thereof at a next output transition of said comparator means, during an operating cycle of said voltage-to-frequency converter next following a cycle during which said first bistable circuit means responds to said output transition in said predetermined direction from said comparator means.

* * * * *

UNITED STATES PATENT AND TRADEMARK OFFICE
CERTIFICATE OF CORRECTION

PATENT NO. : 4,992,673
DATED : February 12, 1991
INVENTOR(S) : Gessaman, et al.

It is certified that error appears in the above-identified patent and that said Letters Patent is hereby corrected as shown below:

On the title page of the patent:

Change "Bill Gessaman" to -- William K. Gessaman --,

Change "Paul Lantz" to -- Paul R. Lantz --, and

Change "Jon Parle" to -- Jonathan J. Parle --.

Signed and Sealed this

Twenty-third Day of January, 1996

*Attest:*

BRUCE LEHMAN

*Attesting Officer*  *Commissioner of Patents and Trademarks*